(12) United States Patent  (10) Patent No.: US 8,011,058 B2
Cheng et al.  (45) Date of Patent: Sep. 6, 2011

(54) SINGULATION HANDLER SYSTEM FOR ELECTRONIC PACKAGES

(75) Inventors: Chi Wah Cheng, New Territories (HK); Wang Lung Alan Tse, North Point (HK); Tim Wai Tony Mak, Chai Wan (HK); Ming Cheong Kary Tse, Ap Lei Chau (HK)

(73) Assignee: ASM Assembly Automation Ltd, Hong Kong (HK)

( * ) Notice: Subject to any disclaimer, the term of this patent is extended or adjusted under 35 U.S.C. 154(b) by 984 days.

(21) Appl. No.: 11/925,091

(22) Filed: Oct. 26, 2007

(65) Prior Publication Data

US 2008/0101894 A1 May 1, 2008

Related U.S. Application Data

(60) Provisional application No. 60/863,668, filed on Oct. 31, 2006.

(51) Int. Cl.
*A47L 5/38* (2006.01)
(52) U.S. Cl. .............................. 15/310; 15/302; 15/306.1
(58) Field of Classification Search ............ 15/301–303, 15/306.1, 310; 414/222.13, 223, 1, 752.1; 125/35
See application file for complete search history.

(56) References Cited

U.S. PATENT DOCUMENTS

| 6,165,232 A | 12/2000 | Tieber et al. | |
|---|---|---|---|
| 6,446,354 B1 * | 9/2002 | Na | 34/236 |
| 6,655,045 B2 | 12/2003 | Cheung et al. | |
| 7,829,383 B2 * | 11/2010 | Yang | 438/113 |
| 2005/0134256 A1 * | 6/2005 | Cheng et al. | 324/158.1 |
| 2006/0154386 A1 * | 7/2006 | Cheng et al. | 438/15 |
| 2008/0213975 A1 * | 9/2008 | Yang | 438/460 |

* cited by examiner

*Primary Examiner* — Dung Van Nguyen
(74) *Attorney, Agent, or Firm* — Ostrolenk Faber LLP

(57) ABSTRACT

A singulation handler system is provided for a strip of electronic packages, which comprises an onloader located adjacent to an onloading location for providing an unsingulated strip of packages for singulation and a cutting jig for mounting the strip of unsingulated packages. The cutting jig is movable between the onloading location and a singulation location at which the strip is singulated by a singulation engine. The system further includes a buffer boat for holding singulated packages that have been removed from the cutting jig and which is operative to convey the singulated packages in a fixed relative orientation. A gang pick head is operative to transfer multiple singulated packages simultaneously from the buffer boat to a rotary turret device and an offloader is provided for transferring singulated packages from the rotary turret device to containers in which the singulated packages are storable.

19 Claims, 12 Drawing Sheets

FIG. 8A  FIG. 8B

SINGULATION HANDLER SYSTEM FOR ELECTRONIC PACKAGES

CROSS REFERENCE TO RELATED APPLICATION

This application claims the benefit and priority of U.S. Provisional Application Ser. No. 60/863,668 filed on Oct. 31, 2006, and entitled APPARATUS AND METHOD FOR SINGULATING AND HANDLING ELECTRONIC PACKAGES, the disclosure of which is incorporated herein by reference.

FIELD OF THE INVENTION

The invention relates to the separation by dicing of electronic packages formed on a common carrier, and in particular to the handling of individual electronic packages for separation by dicing and for further processing after dicing.

BACKGROUND AND PRIOR ART

During assembly and packaging, multiple semiconductor dice are usually placed onto a single carrier in array form and processed in bulk for increasing productivity. After electrical connections are made between the dice and the carrier, the dice, together with the electrical connections should be encapsulated with molding compound to protect them from the external environment. Thereafter, the resulting packages that encapsulate the dice have to be cut to separate them from one another.

The separation of the electronic packages is typically conducted by sawing. After sawing, the packages need to be further processed, for example by washing, drying, inspection and finally offloading. One sawing approach is disclosed in U.S. Pat. No. 6,165,232 entitled "Method and Apparatus for Securely Holding a Substrate During Dicing", which approach may be conveniently referred to as a nesting jig sawing approach. The nesting jig saw has been one popular type of sawing method implemented in the industry. A nest having a grid arrangement is put onto a saw jig before sawing, and a substrate to be sawn is supported on the nest. After sawing, an upper nest is placed onto the sawn packages. Thereafter, all the sawn packages and the lower and upper nests are carried together to other processing stations by a pick arm. Subsequent processes, such as pick and place and sorting according to inspection results, are performed in conjunction with the "nested" packages. The sorted good packages will then be offloaded to plastic tubes, trays or canisters, while bad packages are offloaded to reject bins or reject/rework trays.

However, the handling of sawn packages in this way is complicated as nests (both upper and lower) are required during sawing as well as during the washing and drying processes. The nests can be complex to fabricate and to use when the package size becomes small, say 3 mm×3 mm, and the density of the packages on the carrier becomes high. Hence, high costs may be incurred for conversion kits to cater for different package dimensions and for subsequent handling. For the same reason, setup and conversion time are increased.

Another approach is disclosed in U.S. Pat. No. 6,446,354 entitled "Handler System for Cutting a Semiconductor Package Device". It discloses an alternative method of handling packages after sawing, without the use of a nesting jig saw. Instead, the sawn packages are either collected by a transfer carrier, or collected by a vacuum head. Subsequent processes are similar to those performed in other handlers, such as washing and drying, inspection of the molded surfaces for markings and lead surface inspection.

In this approach, the substrate is sawn on a saw jig and held by vacuum only during the process of sawing. After sawing, packages are picked by vacuum and transferred for washing and drying while the packages are still held by the vacuum head. After cleaning and drying, the packages are placed onto a hot plate with an array of small vacuum holes for secondary drying and lead or ball inspection. Thereafter, half of the packages are put onto a turntable with a buffer plate on top (on which pockets are arranged in alternating format), while the other half are put onto the second half of the buffer plate. The buffer plate can rotate if required in order to rotate the packages to a preferred orientation before being picked up by dual offload pick arms for offloading.

A shortcoming of the above process is that a complicated buffer plate is required in order to accommodate the packages effectively, since some form of guiding wall has to be provided for each pocket. Therefore, more expensive fabrication methods are required. The buffer plate would be even more complicated and expensive when the packages decrease in size (to say, 3 mm×3 mm) and the density of packages is higher. There is also potential that the sawn packages might not sit properly (e.g., they might be tilted) in the pockets of the buffer plate due to improper placement. On the one hand, the clearance between the pocket walls and the packages cannot be too large, or the subsequent offloading process cannot accurately put the packages into a tray or a tube. On the other hand, too small a clearance can lead to unstable positioning of the packages on the buffer plates. This contradictory phenomenon is more obvious when handling smaller packages (e.g., 2×2 mm and 3×3 mm).

Yet another non-nesting approach is disclosed in U.S. Pat. No. 6,655,045 entitled "Apparatus and Method for Pick and Place Handling". Instead of sawn packages being picked up by vacuum, a gang transfer arm conveys all the sawn packages to various processing stations with a "sliding" approach. The sawn packages are slid by a rinsing carrier from the saw jig to the rinsing platform and by a drying carrier for the drying process on the same platform. The packages are subsequently moved row by row onto a transfer track where the packages are separated at the track end. Inspection will then be conducted before offloading the packages to a tray, tube, reject bin or canister according to the inspection result.

A disadvantage of the said method is that the conversion kit to cater for different packages is complicated, especially for the rinsing and drying carriers. As a result, the conversion kit can be costly. The set-up and conversion are difficult as quite a lot of leveling adjustments are required in order to effectively slide the sawn packages across various processing stations on the same platform. Furthermore, only top inspection can be provided as the bottom surfaces of the packages are supported on the platform.

SUMMARY OF THE INVENTION

It is thus an object of the invention to seek to provide a singulation handler system for strips of electronic packages which avoids at least some of the above shortcomings of prior art handler systems.

According to a first aspect of the invention, there is provided a singulation handler system for a strip of electronic packages, comprising: an onloader located adjacent to an onloading location for providing an unsingulated strip of packages for singulation; a cutting jig for mounting the strip of unsingulated packages, the cutting jig being movable between the onloading location and a singulation location at which the strip is singulated by a singulation engine; a buffer boat for holding singulated packages that have been removed from the cutting jig and which is operative to convey the singulated packages in a fixed relative orientation; a gang pick head for transferring multiple singulated packages simultaneously from the buffer boat to a rotary turret device; and an offloader for transferring singulated packages from the rotary turret device to containers in which the singulated packages are storable.

According to a second aspect of the invention, there is provided a carrier device for a singulation handler system for a strip of electronic packages, comprising: a plurality of vacuum holes, each hole being configured to hold a single singulated package; a main body comprising a vacuum chamber which is in communication with the vacuum holes for supplying vacuum suction force to the vacuum holes; and a wall located in the vacuum chamber which is movable relative to the vacuum holes, and which is operative to divide the vacuum chamber into a first portion that is subject to vacuum suction and a second portion that is not subject to vacuum suction; wherein the movable wall is operative to cease communication of vacuum suction force to vacuum holes which are not occupied by singulated packages.

According to a third aspect of the invention, there is provided a pick arm for a singulation handler system for a strip of electronic packages, the pick arm comprising multiple pick-up vacuum heads, and wherein each pick-up vacuum head is further connected to an independently controllable vacuum circuit.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a singulation handler system in accordance with the invention will now be described with reference to the accompanying drawings, in which:

FIG. 8A is a top view of the conversion part of the gang pick arm that is configured for the pick-up of six packages in a row;

FIG. 8B is an inverted view of the conversion part showing the six vacuum pads for carrying six packages;

DETAILED DESCRIPTION OF THE PREFERRED EMBODIMENTS OF THE INVENTION

Figure 1:
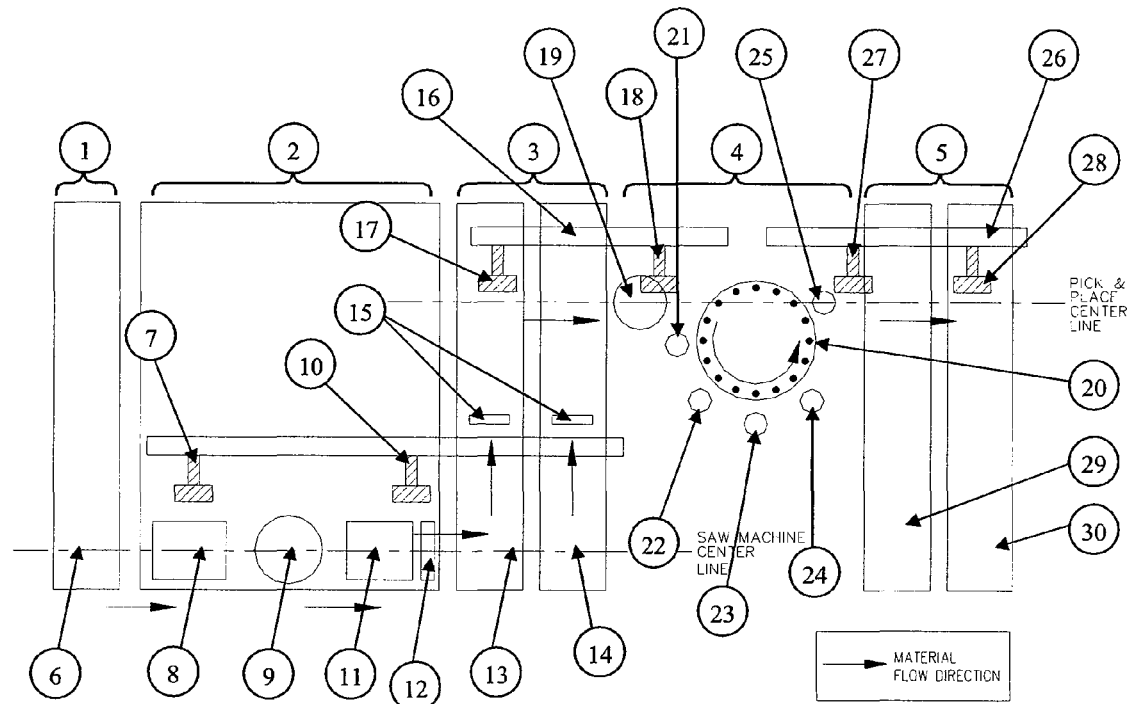
FIG. 1 is a schematic plan view a singulation handler system according to a first preferred embodiment of the invention showing the basic arrangement of various modules of the singulation handler system and materials flow.
Figure 2:
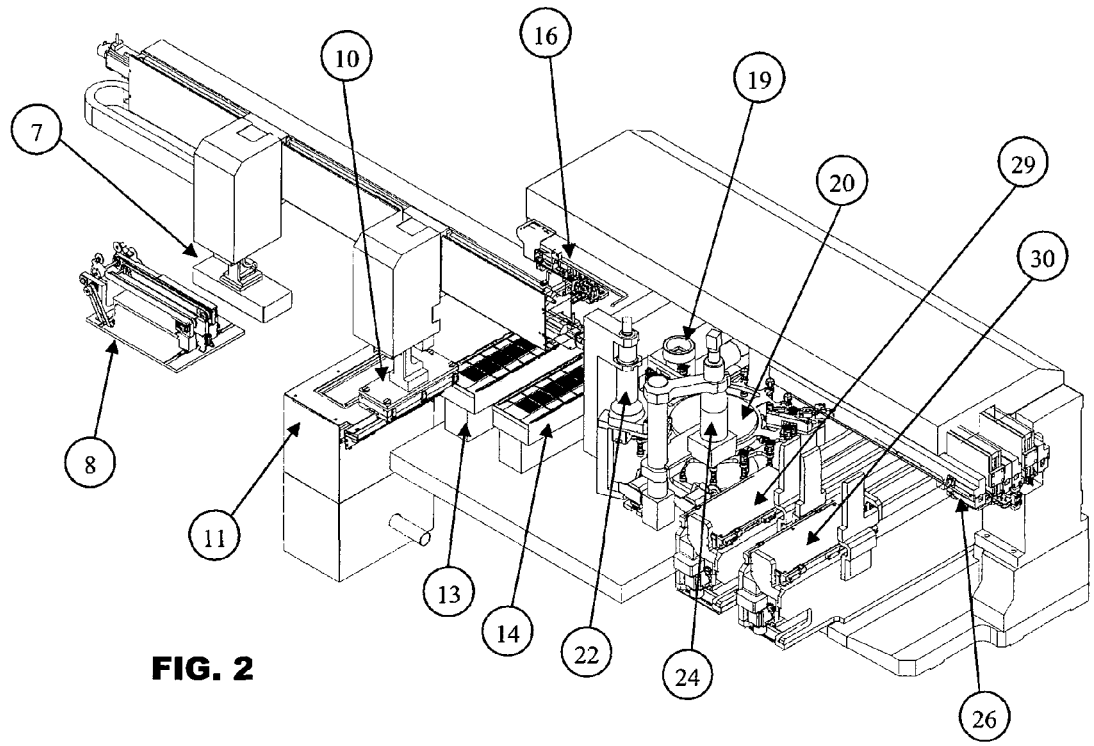
FIG. 2 is an isometric view of the singulation handler system as shown in FIG. 1.

A first aspect of the invention relates to the overall working method and sequence of the singulation handler system for the singulation of strips of electronic packages such as BGA and QFN packages. FIG. 1 is a schematic plan view of a singluation handler system according to the preferred embodiment of the invention showing the basic arrangement of various modules of the singulation handler system and materials flow. FIG. 2 is an isometric view of the singulation handler system as shown in FIG. 1.

A magazine onloader 1 is on the left hand side of an onloading location to provide an unsingulated strip of packages to a singulation or saw engine 2 and a saw handler, the saw handler generally comprising a buffer table module 3, inspection and turret module 4 and offloading module 5 on the right hand side of the saw engine 2. Loading and unloading arms are mounted onto the onloader 1, saw engine 2 and saw handler 3, 4, 5 for carrying materials across the singulation handler system.

The working sequence is as follows:

1. The unsingulated strip of packages is input from a magazine 6 at the position of the onloader 1 located on the left hand side of the onloading location leading to the saw engine 2, and is then brought to a strip précising station 8 at the onloading location by a loading arm 7 so that the position of the strip may be oriented to a predetermined alignment with respect to a cutting jig such as a saw jig. The onloader 1 is located at the side of the onloading location such that a material flow direction of the unsingulated strip of packages to the onloading location is in a direction substantially perpendicular to the direction of movement of the saw jig between the onloading location and the saw engine. The orientation of the input strip is such that that the lengthwise direction of the strip is generally parallel to the "left to right" material flow direction.

2. The loading arm 7 then picks up the aligned strip and transfers the strip to a predetermined loading position of the saw jig located at the chuck table 9 of the saw engine 2. The saw jig is movable between the onloading location and the singulation location at which the strip is singulated by the saw engine 2. Vacuum suction in the saw jig will build up to hold the strip, and then the strip will move towards the saw engine 2 for the sawing process.

3. During the sawing process at the saw engine 2, a second new strip of unsingulated packages will then be input as mentioned in step 1 and will remain at the strip précising station 8 after alignment while the first strip undergoes sawing.

4. Also during sawing of the first strip, the unloading arm 10 will be in a stand-by position above the predetermined position of the chuck table 9 so as to avoid redundant motion time of the unloading arm 10 for picking up the strip.

5. After sawing, the chuck table 9 will move the saw jig and the sawn strip to the predetermined unloading position with an orientation such that the sawn strip's lengthwise direction is perpendicular to the main "left to right" material transfer direction. The unloading arm 10 will pick up all the sawn packages with a vacuum head having vacuum holes arranged in the same pattern as the packages comprised in the strip, from the saw jig on the chuck table 9 of the saw engine 2. Hence, the singulated packages are preferably picked up in the same relative arrangement as they were arranged on the strip before singulation.

6. The loading arm 7 will then place the second strip on the saw jig on the chuck table 9 when the unloading arm 10 moves away from the chuck table 9 and the second strip will undergo the sawing process.

7. The vacuum head of the unloading arm 10 will then go to the washing and drying station 11 where mold surface cleaning by water (or other fluid) and drying take place while the singulated packages are being held by the unloading arm 10. The washing and drying sequence and cycles can be programmable in order to achieve the best cleaning and drying quality of the packages. Rinsing of the top side of the packages is usually already done during sawing as the cooling water for the saw blade can clean the top surface of the packages.

8. While the unloading arm 10 holds the packages by vacuum, secondary mold side drying can be performed at the air knife 12 next to the washing and drying station so as to increase the dryness of the mold surface of the packages such that the subsequent mark inspection on mold side of the packages will not be affected.

9. The packages held by the unloading arm will go to one of two carrier devices such as buffer boats 13, 14 located at the left hand side of the handler module. When the packages held by the vacuum head of the unloading arm 10 comes into close proximity with surfaces of the top plate of the buffer boat 13, 14, the vacuum of the buffer boat 13, 14 will be activated and start to suck the packages on the unloading arm 10. The vacuum of the unloading arm 10 will then be released to atmospheric pressure, while the vacuum of the buffer boat 13, 14 will keep increasing. Eventually, when the vacuum of the buffer boat 13, 14 reaches a satisfactory level (say −60 kpa) and the vacuum of the unloading arm 10 drops to a satisfactory level (say −5 kpa), the transition of all the packages will be completed.

10. The buffer boat 13, 14 will then carry all the singulated packages in a fixed relative orientation to a center line of pick and place in the handler. Preferably, the singulated packages are conveyed in the same arrangement as they were arranged on the strip before singulation. A pair of air knifes 15 are located above the buffer boats 13, 14 and will be activated when the buffer boats 13, 14 pass under them in order to further dry the packages. The buffer boats 13, 14 will stop when the first row of packages held thereon is at a position where the gang pick arm 16 (along the pick and place center line) is able to pick up the packages by vacuum in a row by row manner. The transition of the packages will be similar to that between the unloading arm 10 and the buffer boat 13, 14.

11. The buffer boat 13, 14 will index one row forward when the first row is picked up by the front and back gang pick arms 17, 18 alternately. If the number of packages per row is not more than the number of the vacuum pads of the pick head of the gang pick arm, the whole row of packages can be picked up by one gang pick arm 17, 18.

12. While the sawn packages are going through the handling processes and the second strip is undergoing a sawing process in the saw engine 2, the third new strip will undergo the cycle beginning from step 1. Hence, multiple strips can be worked upon simultaneously.

13. The unloading arm 10 will go to a position above the unloading position of the chuck table 9 of the saw engine 2 and be in a stand-by position for the pick up of the sawn packages of the second strip (repeat from step 5 to 11).

14. The vacuum heads of the dual gang pick arms 16 (one at the front and one at the back) share the same pick and place center line. They will continue to pick up the packages in a row by row manner, until all rows of packages are picked up by the front and back gang pick arms 16.

15. While one gang pick arm 17, 18 goes to pick up packages from the buffer boat 13, 14, another gang pick arm 17, 18 moves the sawn packages towards other downstream processes such as mark inspection at the mark inspection module and then offloading them to the rotary turret device 20.

16. All packages held by the dual gang pick arms 16 will first go on top of the mark inspection station 19 and stop for a while for marking and mold surface inspection.

17. After mark inspection, the gang pick arm 16 will continue to move towards the right hand side to a position above a package collecting position of the rotary turret device 20 where various processes will be performed.

18. The packages on the vacuum head of the gang pick arm will then be transferred to the vacuum head at a placement position (1) (the one along the pick and place center line) of the turret one by one, as in step 10.

19. After the first package is transferred to a turret vacuum head 48, the gang pick arm 17, 18 will index one package pitch to the next package held by the gang pick arm 17, 18 while the rotary turret device 20 rotates one segment to turn the next vacuum head 48 of the rotary turret device 20 for picking up the next package.

20. Repeat step 14 to 19 until all packages held by the gang pick arm 17, 18 are released to the vacuum heads 48 of the rotary turret device 20.

21. After receiving one package, the rotary turret device 20 will successively rotate by further segments and the packages on the vacuum heads of the rotary turret device 20 will go through different processes at different positions simultaneously, including a first précising module 21 for packages positional correction, ball or lead side inspection module 22, a package orientation module 23, a five-side inspection module 24 for QFN packages and a second précising module 25 before being picked up by dual offloading arms 26 at a position along the same pick and place center line.

22. The dual offloading arms 26 are arranged in a similar manner as the dual gang pick arms 16. While one offload arm 27, 28 with multiple vacuum heads (four in this case) collect packages from the vacuum heads at a pick-up position (13) of the rotary turret device 20 by vacuum along the pick and place center line, another offload arm 27, 28 releases the good packages to a container which may comprise either a tray, tube, canister or other offloading media 29, 30 and bad packages to a reject bin according to the inspection results of the marking and/or ball or lead inspection. All the offloading positions of the offloading devices 29, 30 are on the same center line of pick and place.

23. The cycles will continue until all the strips in the onloader 1 are processed.

Figure 3:
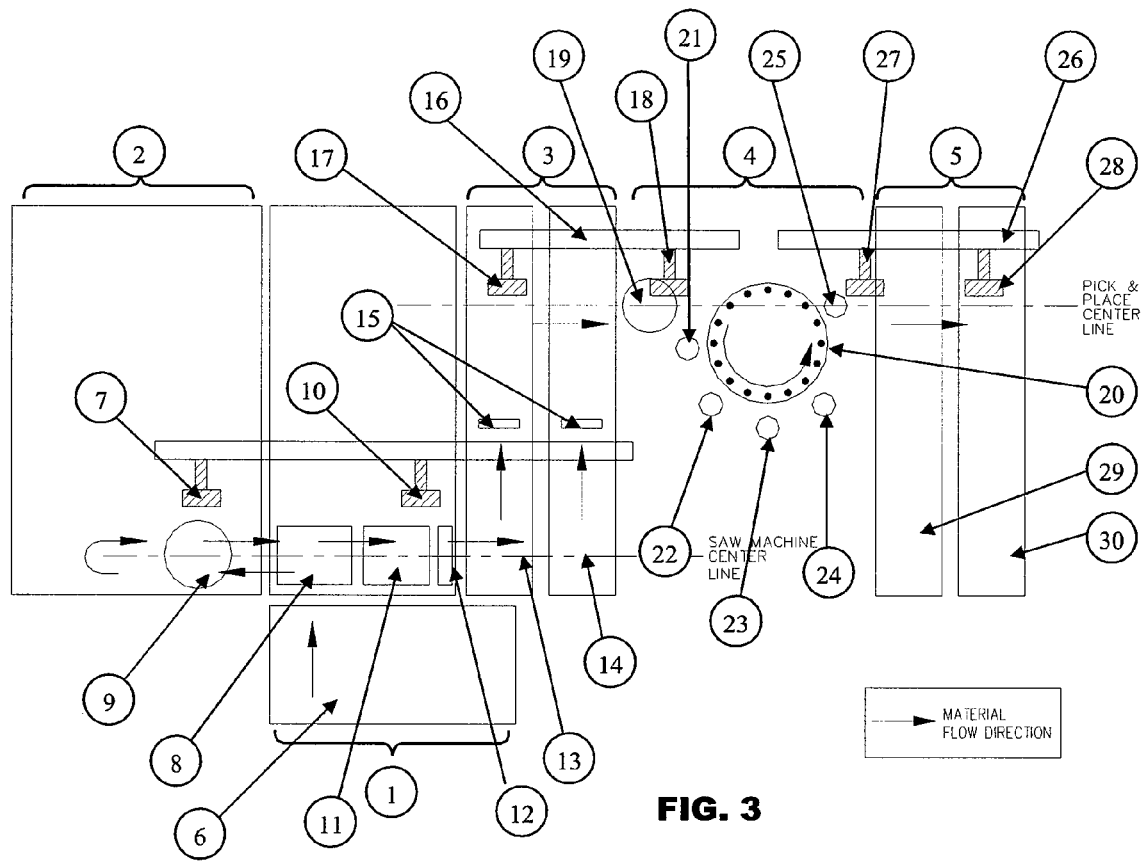
FIG. 3 is a schematic plan view of a singulation handler system according to a second preferred embodiment of the invention showing an alternative arrangement of various modules of the singulation handler system and materials flow.

However, the first aspect of the invention is not limited to the said strip input direction, which is to convey unsingulated strips of packages from the left side of the saw engine 2 to the right side of the saw engine 2. FIG. 3 is a schematic plan view of a singulation handler system according to a second preferred embodiment of the invention showing an alternative arrangement of various modules of the singulation handler system and materials flow. The magazine onloader 1 is placed in the front of the saw engine 2.

The onloader 1 is located such that a material flow direction of an unsingulated strip of packages to the onloading location is in a direction substantially parallel to the direction of movement of the saw jig between the onloading position and the saw engine 2. Accordingly, the strips are rotated by 90 degrees as compared to that shown in FIG. 1 such that a strip is input so that the length of the strip is perpendicular to the main material flow direction and parallel to the sawn strip orientation after sawing. Separate modules for mounting loading and unloading arms, accommodating the précising station and the cleaning station are placed in between the saw engine 2 and the saw handler system 3, 4, 5 which is similar to the saw handler system shown in FIG. 1.

As shown in FIG. 3, the input of the unsingulated strips of packages can be from a magazine onloader 1 located at the front of a new loading and unloading module. However, the orientation of the onloader is perpendicular to that of the first embodiment. Hence, the second embodiment of the working sequence has a different loading and unloading sequence that will be described as follows:

1. A strip is input from a magazine onloader 1 in an orientation such that the lengthwise direction of the strip is perpendicular to the overall "left to right" main material transfer direction.

2. A separate module, namely the loading and unloading module which is placed in between the saw engine 2 and the handler module, consists of loading and unloading arms 7, 10, a strip précising station 8, a cleaning station 11 (mold side washing and drying) and a secondary mold side drying station 12.

3. The strip that is input from the onloader 1 goes into the strip précising station 8 where the strip is aligned to a predetermined orientation. The orientation of the input strip is in such a way that the lengthwise direction of the strip is perpendicular to the "left to right" main material flow direction.

4. The loading arm 7 then picks up the aligned strip and transfers the strip to a predetermined loading position of a saw jig on the chuck table 9 of the saw engine 2. The orientation of the saw jig and chuck table 9 are aligned to match that of the input strip. The vacuum of the saw jig will build up to hold the strip, and the strip will move towards the saw for the sawing process.

5. The remaining sequence will follow steps 3 to 23 of the first embodiment.

A third aspect of the invention relates to the design of the dual buffer boats 13, 14, the transfer of sawn packages from the unloading arm 10 to the dual buffer boats 13, 14, and from the dual buffer boats 13, 14 to the dual gang pick arms 16.

Figure 4A:
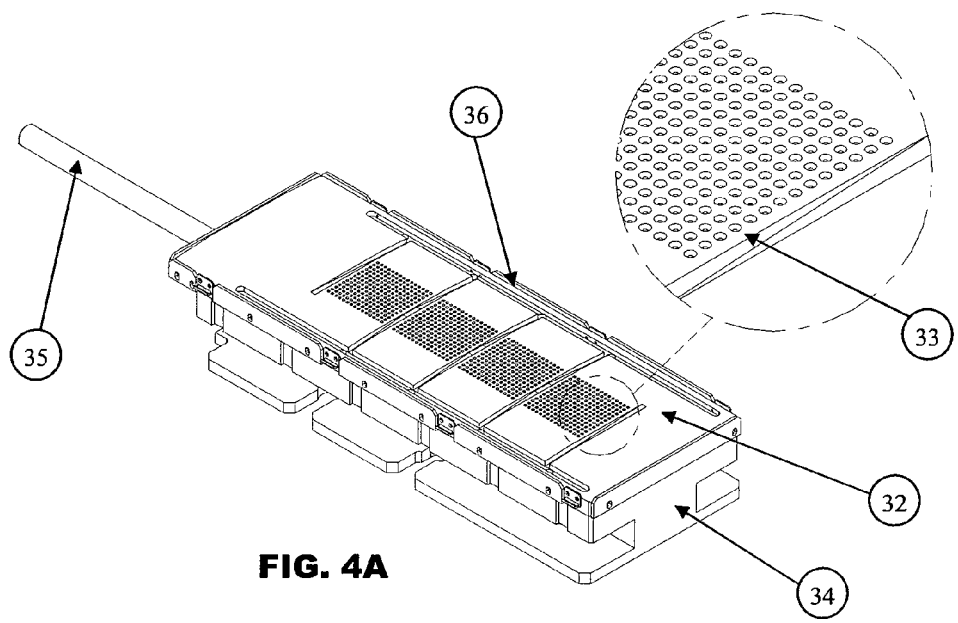
FIG. 4A is an isometric view of a buffer boat comprised in the singulation handler system with a vacuum plate on top that is not holding any packages.
Figure 4B:
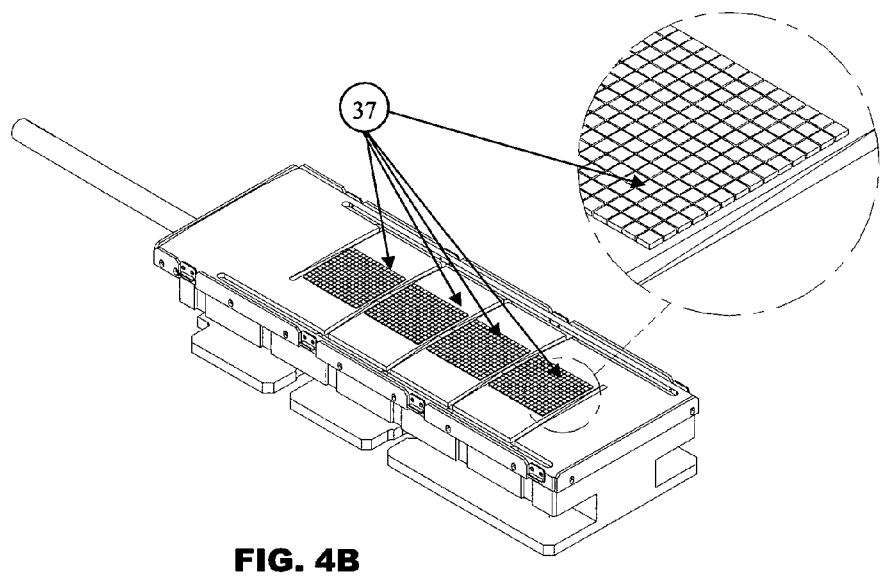
FIG. 4B shows an isometric view of the buffer boat with the vacuum plate holding an array of packages.

FIG. 4A is an isometric view of a carrier device in the form of a buffer boat comprised in the singulation handler system with a vacuum plate on top that is not holding any packages. The vacuum plate 32 is a simple plate with an array of small holes 33 to hold packages in the same pattern as they were created on the strip. One small hole 33 is used for holding one sawn package 37, and no complicated guiding is required. Side barriers 36 along the sides of the buffer boat 13, 14 prevent packages 37 from dropping off the vacuum plate 32. FIG. 4B shows an isometric view of the buffer boat with the vacuum plate holding an array of packages.

The transfer of packages from unloading arm's vacuum head to the vacuum plate of one of the buffer boats are as follows:

1. The unloading arm 10 comes into close proximity with the vacuum plate 32 of one of the buffer boats 13, 14.

2. After the vacuum suction of the buffer boat 13, 14 is activated, vacuum at the vacuum head of unloading arm 10 is reduced and thus sawn packages 37 can be transferred to the vacuum plate 32 without significant dislocation.

3. The loaded buffer boat 13, 14 then moves into position for the pick-up of the sawn packages 37 by the gang pick arms 16 as mentioned above.

Another buffer boat 13, 14 will then go to a standby position for unloading packages 37 from the next sawn strip after all packages are transferred to the gang pick arm 16. The dual buffer boats 13, 14 receive packages from the unloading arm and transfer packages to the gang pick arms 16 alternately in such a manner that minimal delay, if any, is encountered during the transportation of the packages 37.

Figure 5:
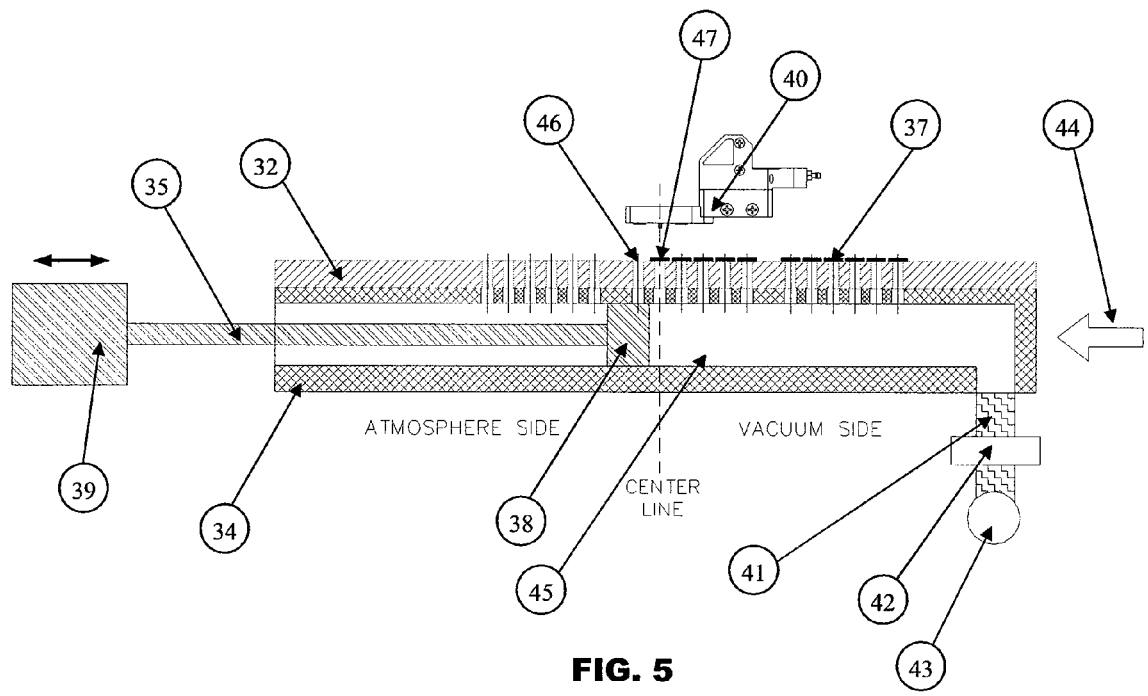
FIG. 5 is a cross-sectional side view of the buffer boat which illustrates how a required vacuum force is generated to hold the packages onto the vacuum plate.

FIG. 5 is a cross-sectional side view of the buffer boat 13, 14 which illustrates how a required vacuum force is generated to hold the packages 37 onto the vacuum plate 32. The singulated packages are transferred from the buffer boats 13, 14 to the gang pick arms 16. The vacuum plate 32 of the buffer boat 13, 14 as shown in FIG. 4A is made of a flat surface on which an array of small through vacuum holes 33 are arranged to match the positions of the array of the packages of the sawn strip unloaded from the unloading arms 10. Each vacuum hole 33 is configured to hold a single singulated package. A vacuum path 41 connects a vacuum chamber 45 in a main body of the buffer boat 13, 14 to a vacuum source 43. The vacuum chamber 45 is in communication with the vacuum holes 33. A vacuum regulator 42 is operative to control the vacuum force to be applied on the packages 37. The transfer process is as follows:

1. Transfer of a first row of packages: The buffer boat 13, 14 moves to a position where the first row of the packages are aligned with the pick and place center line such that the dual gang pick arms 16 can pick up multiple packages simultaneously.

a) During transportation of the buffer boat 13, 14 at high speed and during package transfer from the unloading arm 10 to the buffer boat 13, 14, the packages on the vacuum plate 32 of the buffer boat 13, 14 are held firmly by the suction force of the array of small holes 33 that are maintained at a high vacuum (say −50 kPa) by a common vacuum source, e.g., vacuum generator or vacuum pump.

b) When a pick head finger 40 of the gang pick arm 17, 18 comes into close proximity with the vacuum plate 32 of buffer boat 13, 14 and contact the packages, the holding force on the packages from the vacuum plate 32 is reduced significantly by reducing the vacuum pressure of the buffer boat 13, 14 to a level (say −10 kPa) such that the pick head finger 40 can exert a sufficient net force to pick up the packages by vacuum (say −6 kPa). The vacuum reduction of the buffer boat 13, 14 is achieved by electrically switching the vacuum path from connection to a vacuum directly to connection to a vacuum regulator so as to control or reduce the vacuum pressure to a preset value.

c) As regards the first row of packages 37 picked up, the vacuum stability is still not a problem as the number of empty holes 33 is still limited even after the first gang pick arm 17, 18 picks up the packages and leaves a limited number of empty holes (for example, six empty holes). Therefore, the vacuum leakage is still not serious.

2. Transfer of a second row and subsequent rows of packages a) To pick up the next row of packages, the buffer boat 13, 14 is moved in direction 44 to move the next row of packages into alignment with a center line corresponding to a position of the pick head finger 40. As shown in FIG. 5, when more rows of packages are removed from the buffer boat 13, 14, more and more empty holes 33 exist and therefore vacuum leakage problem is so serious that the vacuum regulator 42 cannot maintain the vacuum at the preset value.

b) To solve this problem, a piston-like component is provided inside the vacuum chamber 45 of the buffer boat which comprises a wall 38 which is movable relative to the vacuum holes 33. The wall 38 is operative to divide the vacuum chamber 45 into a first portion that is subject to vacuum suction and a second portion that is not subject to vacuum suction. The movable wall 38 is operative to cease the supply of vacuum suction force to the vacuum holes 33 that are not occupied by singulated packages. At one end of the chamber 45, the vacuum regulator 42 and vacuum source 43 are connected to the first portion of the vacuum chamber 45 that is subject to vacuum suction.

c) The movable wall 38 is always located in front of the row of vacuum holes 33 that are holding singulated packages 47 which are being removed from the buffer boat 13, 14. The vacuum plate 32 is indexed by one row after all the packages in the current row are removed. The rows of holes 46 corresponding to the previously-picked packages that are not occupied by singulated packages are thus substantially isolated from the vacuum source 43 and therefore the vacuum leakage is limited to the current row of packages 47 being picked up. As a result, the vacuum level can be maintained at an acceptable level of about −5 to −10 kPa, which is large enough to avoid the dislocation of packages 37 during row by row indexing of the buffer boat 13, 14, while small enough for packages transfer to the pick heads of the gang pick arms.

d) At an end of the vacuum chamber 45 of the buffer boat 13, 14, opposite to the end connected to the vacuum source 43, the wall 38 may be further connected through a rod 35 to a linear motion drive system 39, such as a timing belt or a lead screw and stepping motor. Thus, the required position of the wall 38 can be easily achieved through the linear motion drive system 39 and/or by movement of the vacuum plate 32.

e) The above sequence will continue until all rows of packages are picked up from the buffer boat 13, 14.

A fourth aspect of the invention relates to the design and operation of the gang pick arm 16. The general working sequence has already been described in relation to the first aspect of the invention.

Figure 6:
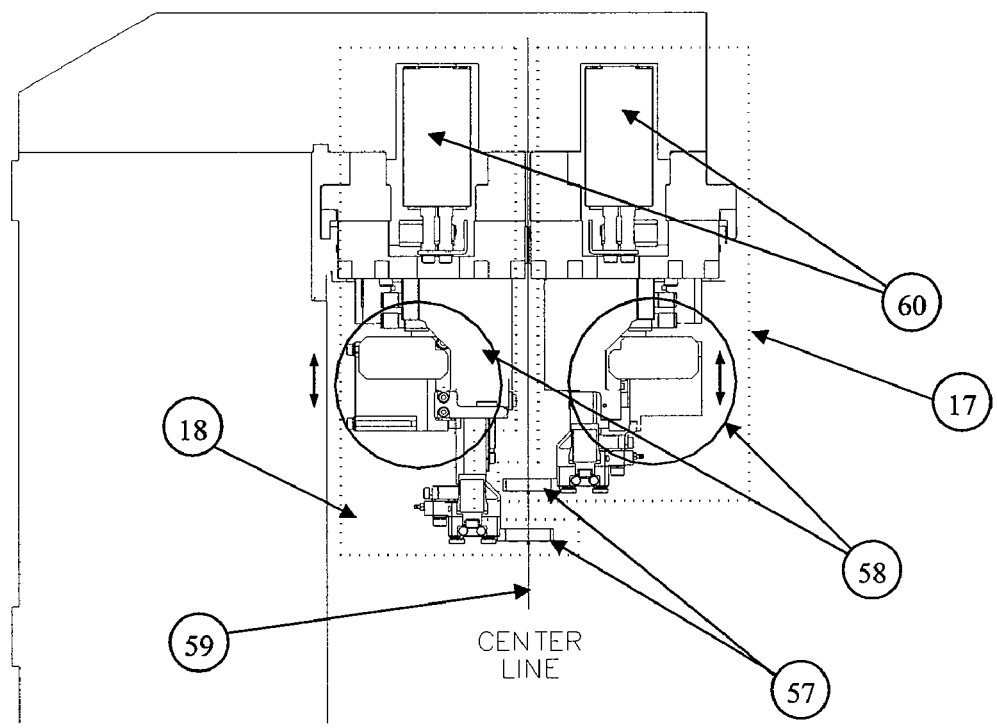
FIG. 6 is an end view of the dual gang pick arms showing their face to face co-center relationship and the basic structure.
Figure 7:
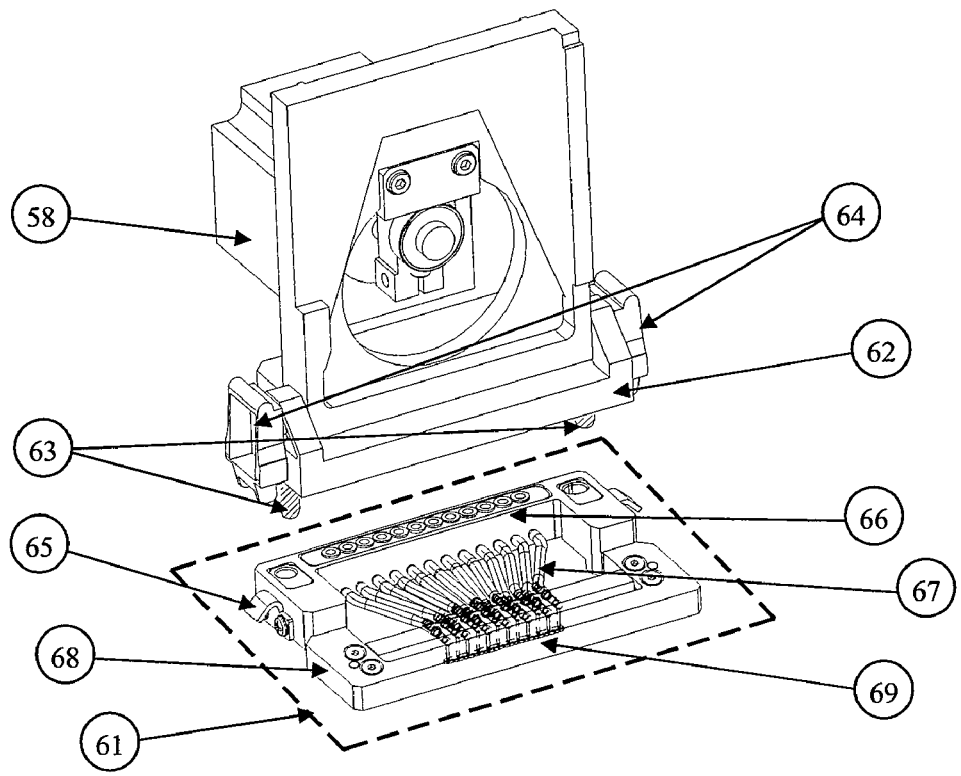
FIG. 7 is the isometric view of the gang pick arm showing its standard base part and its conversion part.
Figure 8C:
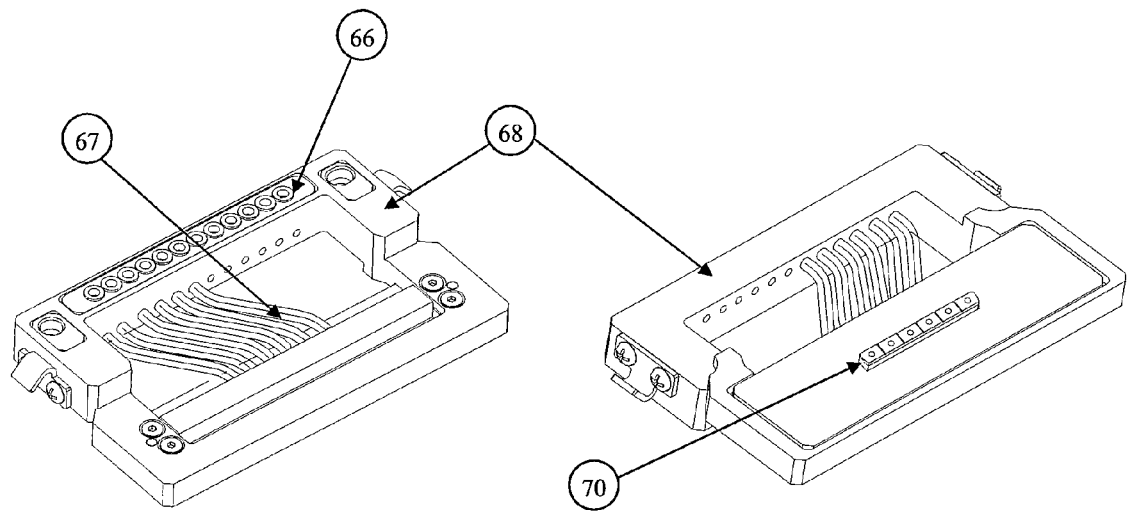
FIG. 8C is an isometric view of the gang pick arm illustrating individual vacuum control valves for each gang pick arm pick head.

FIG. 6 is an end view of the dual gang pick arms showing their face to face co-center relationship and their basic structure. FIG. 7 is the isometric view of the gang pick arm showing its basic part and its conversion part. FIG. 8A is a top view of the conversion part that is configured for the pick-up of six packages in a row. FIG. 8B is an inverted view of the conversion part showing the six vacuum pads for carrying six packages. FIG. 8C is an isometric view of the gang pick arm illustrating individual vacuum control valves for each gang pick arm pick head.

In order for the dual gang pick arms 17, 18 to work successfully for the aforementioned sequence, the configuration is as follows:

1. The dual gang pick arms 17, 18 are arranged in a face to face manner as shown in FIG. 6 in such a way that their multiple pick-up vacuum heads 57 are all aligned along the pick and place center line of the system. As a result, both of them can pick up packages from buffer boat 13, 14 at a common position, such as the same Y position, and more importantly release packages one by one to the vacuum head 48 of the rotary turret device 20 at same placement position (1). The turret 20 is a rotational device and thus preferably only provides a single repeatable placement position to receive the packages from both the gang pick arms 17, 18.

2. The gang pick arms 17, 18 can be driven by common linear motion driving systems, such as ball screws and servo motors. However, it is preferably driven by direct drive linear motors 60 for sake of simplicity and accuracy.

3. Vertical motion of the gang pick arms 17, 18 is needed in order to avoid them hitting each other when traveling in opposite directions back and forth from packages pick up and release positions. The vertical motion can be easily achieved by applying an eccentric mechanism and stepping motor 58 as shown in FIG. 7.

Figure 8C:
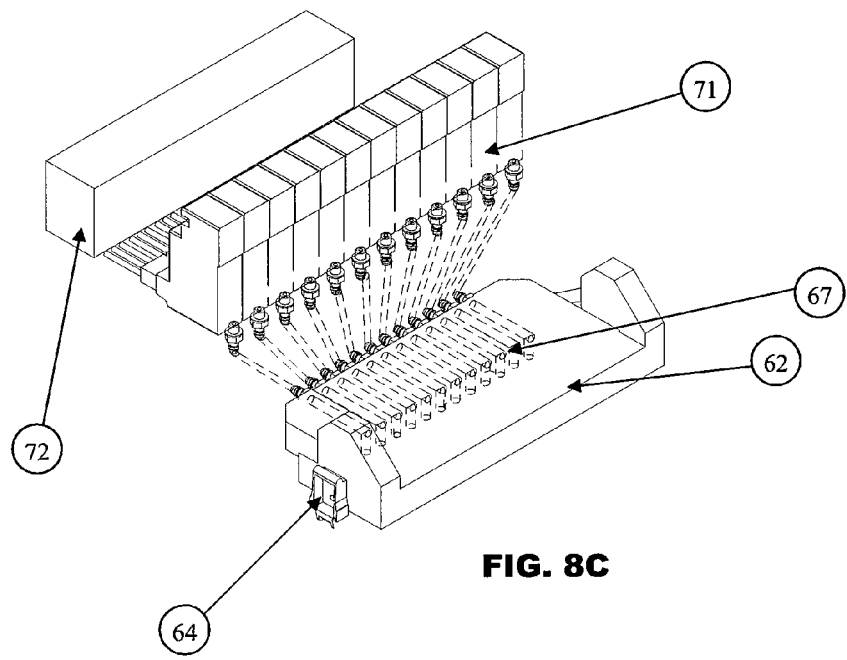

4. On one hand, the gang pick arms 17, 18 are required to pick up multiple packages from buffer boat 13, 14 simultaneously. On the other hand, they also need to release packages one by one because of the rotational nature of the turret device 20. Therefore, they are designed as follows:

a. Each gang pick arm 17, 18 can handle a maximum of twelve packages and therefore twelve independently controlled vacuum circuits 67, including twelve solenoid control valves 71, that are connected to the respective pick-up vacuum heads 57 for controlling the vacuum supply from a vacuum source 72, are provided as shown in FIG. 8C.

b. The gang pick arm 17, 18 is divided into two parts. A standard base part 62 that is permanently mounted onto the motion axes carries all the vacuum control devices and acts as a standard base for the package size and pitch dependent convertible lower part 61.

c. A convertible lower part 61 can be easily changed from one configuration to another through location pins 63 and holes as shown in FIGS. 7 and 8, and a pair of quick release locks 64, 65. A seal plate 66 covering the vacuum paths 67 prevents vacuum leakage between the pick head 62 and the convertible lower part 61. A pick head adaptor 68 assists attachment of the pick head 62 to the convertible lower part 61.

d. When handling strips of different numbers of packages per row, the number of vacuum heads 69 of the lower part 61 of the gang pick arm 17, 18 is the same as the number of the packages per row of the strip if it is not more than twelve or other predetermined number. As in FIGS. 8A and 8B, six vacuum heads 70 are provided to match a strip of 6 packages per row. Vacuum paths 67 of the unused circuits will be shut down by the solenoid valves 71 accordingly.

e. When the number of packages per row is more than the maximum number of vacuum heads 70 comprised in the gang pick arm 17, 18, the two gang pick arms 17, 18 may share the packages evenly. For example, if a strip has 19 packages per row, one arm may have ten vacuum heads 70 while the other arm 17, 18 may have nine vacuum heads 70.

Figure 9:
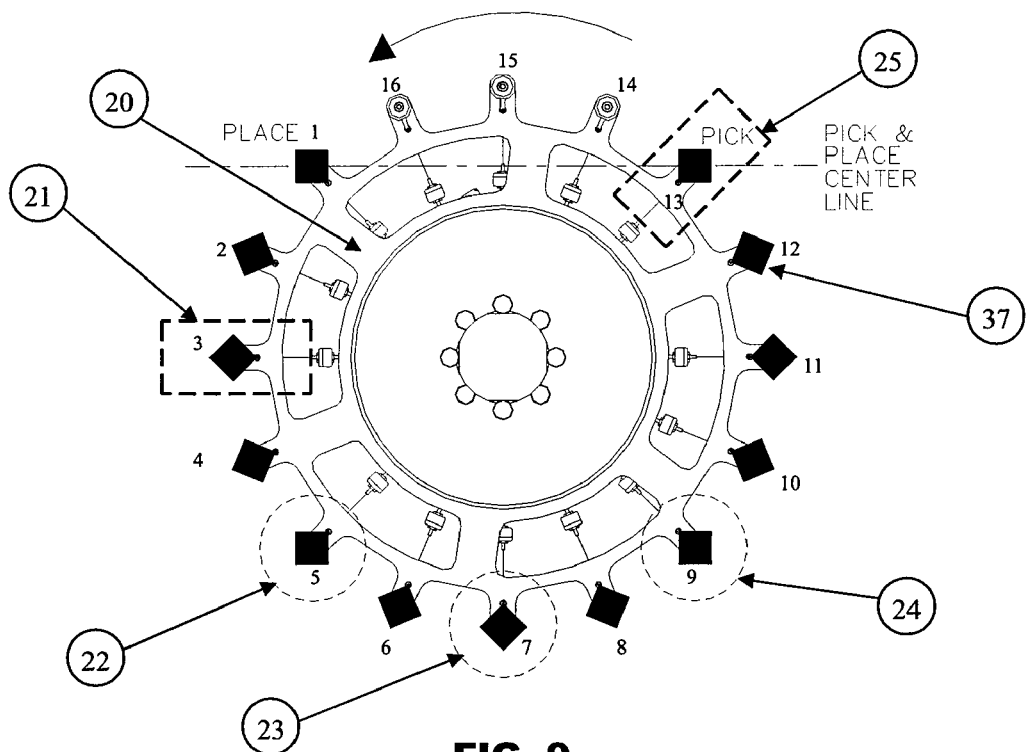
FIG. 9 is a plan view of the rotary turret device showing the basic arrangement of its components.
Figure 10:
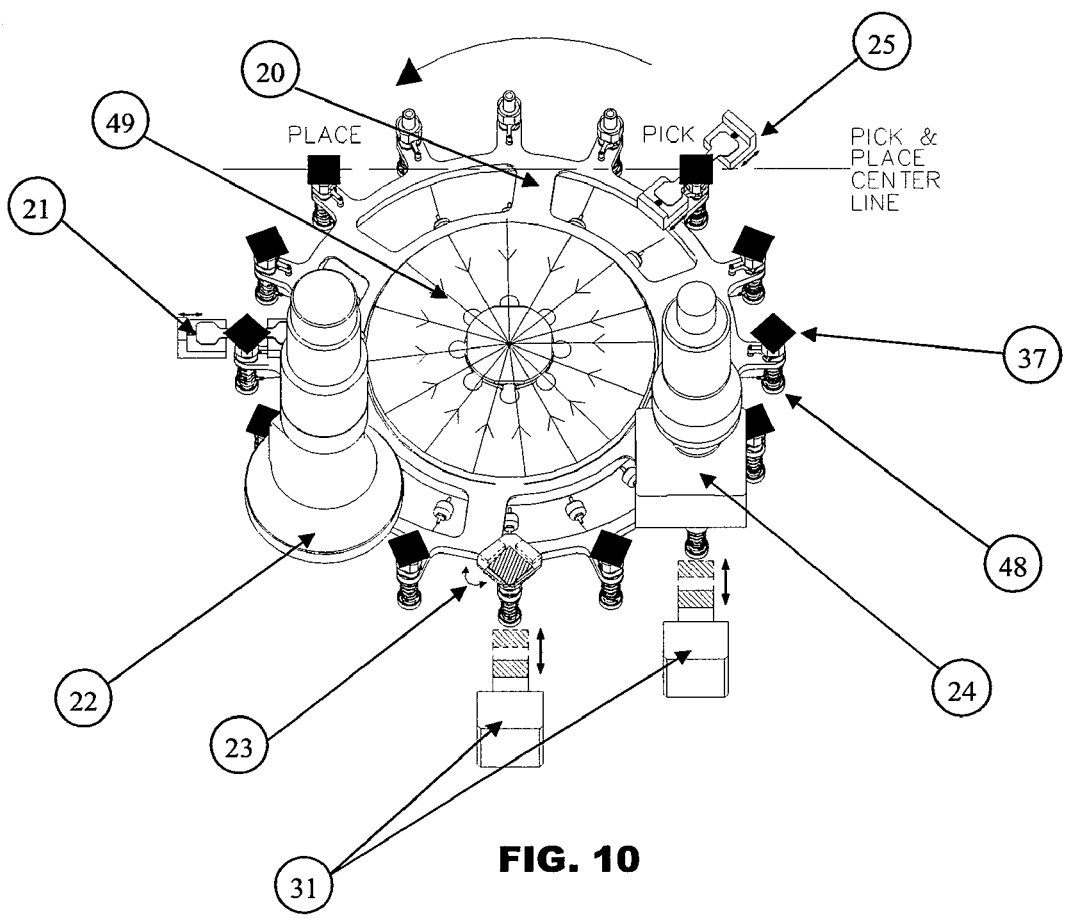
FIG. 10 is an isometric view of the rotary turret device.

A fifth aspect of the invention relates to the rotary turret device 20 that provides sixteen vacuum heads 48 that are spaced along the rotary turret device 20, each vacuum head 48 being configured to hold a single package. The vacuum heads 48 rotate segment by segment in an anti-clockwise direction from position (1) to position (16). FIG. 9 is a plan view of the rotary turret device showing the basic arrangement of its components. FIG. 10 is an isometric view of the rotary turret device.

Position (1) and position (13) are located on the pick and place center line of the system. The former is the position of the vacuum head 48 of rotary turret device 20 to receive sawn packages 37 from the gang pick arms 16, while the latter is the position of the vacuum head 48 of rotary turret device 20 to transfer packages 37 to dual offload arms 26. The vacuum heads are preferably all connected to a central vacuum source via multiple vacuum paths 49.

Along the rotational path of the vacuum heads 48 as shown in FIGS. 9 and 10, there can be various processing and inspection devices. The arrangement may be as follows:

1. The first package précising system 21 is placed at position (3), or a position upstream of the rotator 23 that does not affect the operations of other adjacent modules.

2. A package upper surface inspection module 22 for ball or lead inspection is placed at position (5), or any other position that does not affect the operations of other adjacent modules.

3. A package rotator 23 is placed at position (7), or other position downstream of the first package précising system 21 that does not affect the operations of other adjacent modules. As a result, the nominal position of the rotator 23 is close to the position of the packages 37 when turning to the segment of the rotator 23 such that the chance of the rotator 23 damaging the package 37 is largely reduced.

4. A five-side inspection module 24 is located at position (9), or a position downstream of the first package précising system 21 that does not affect the operations of other adjacent modules. Five-side inspection is especially useful for QFN packages that can have lead defects such as smear, burr, etc., on their upper surface and four sides.

5. A second package précising system 25 is located at position (13) where the packages are picked up by the dual offload arms 26. This second package précising system 25 is especially useful and important for accurate placement of packages 37 when offloading to tray pockets. The working sequence is as follows:

a. The package on a vacuum head 48 of the rotary turret device 20 is turned to position (13).

b. The two précising clamps of the second package précising system 25 move from an open state to a closed state such that the package 37 is aligned to a preset position that preferably corresponds to the required position of the offloading device 29, 30, say tray pockets, when the dual offloading arms 26 transfer the packages from the vacuum head at position (13) to the offloading device 29, 30.

c. After the package 37 is picked up by the dual offload arms 26, the two précising clamps return to their open state.

The operational sequence as shown above plays a key role in system efficiency because of the ability to simultaneously process sawn packages 37 at various positions of the rotary turret device 20. After finishing various processes (which take place simultaneously), all packages 37 on the turret's vacuum heads 48 rotate one segment ahead. With such an arrangement, the processing of packages at the more time-consuming processes such as five-side inspection will not affect the system running speed, or will only slightly impact speed when some processes are extraordinarily longer than the average processing time of the other processes at different segments.

For packages with large differences in size, different sizes of vacuum heads 48 are required. To ease the change of the vacuum heads 48 and thus achieve shorter conversion time, the vacuum heads 48 are detachable and can be screwed onto head bases that are fixed onto the rotary turret device 20.

Figure 11:
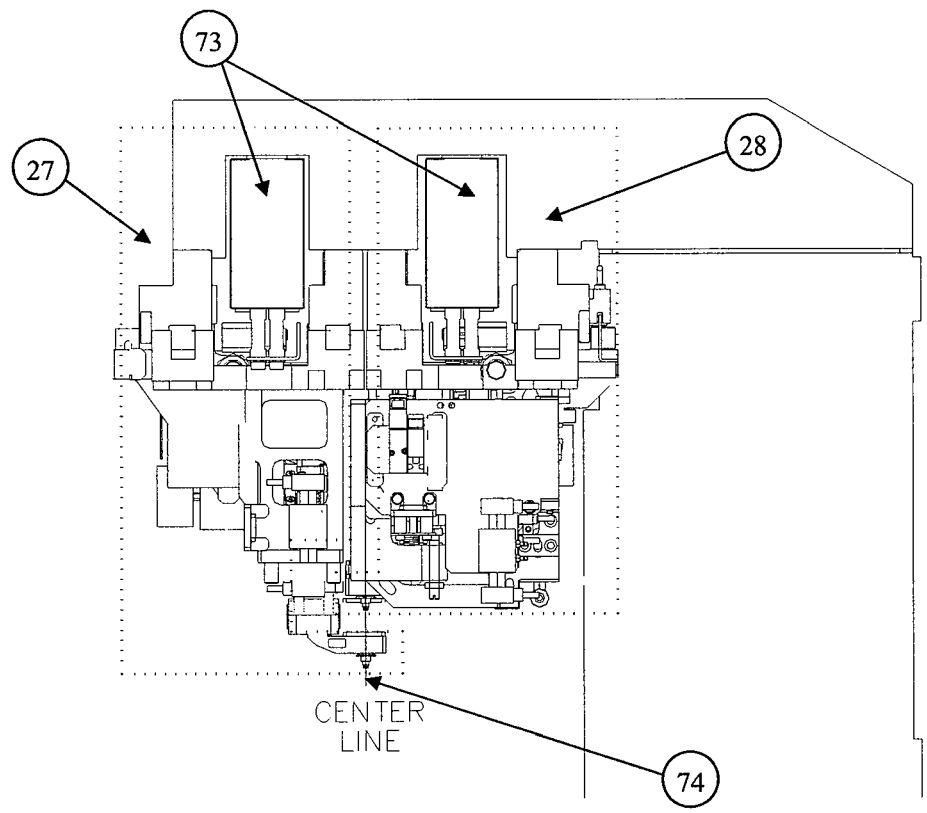
FIG. 11 is an end view of the dual offload arms showing their face to face co-center relationship and their basic structure.
Figure 12:
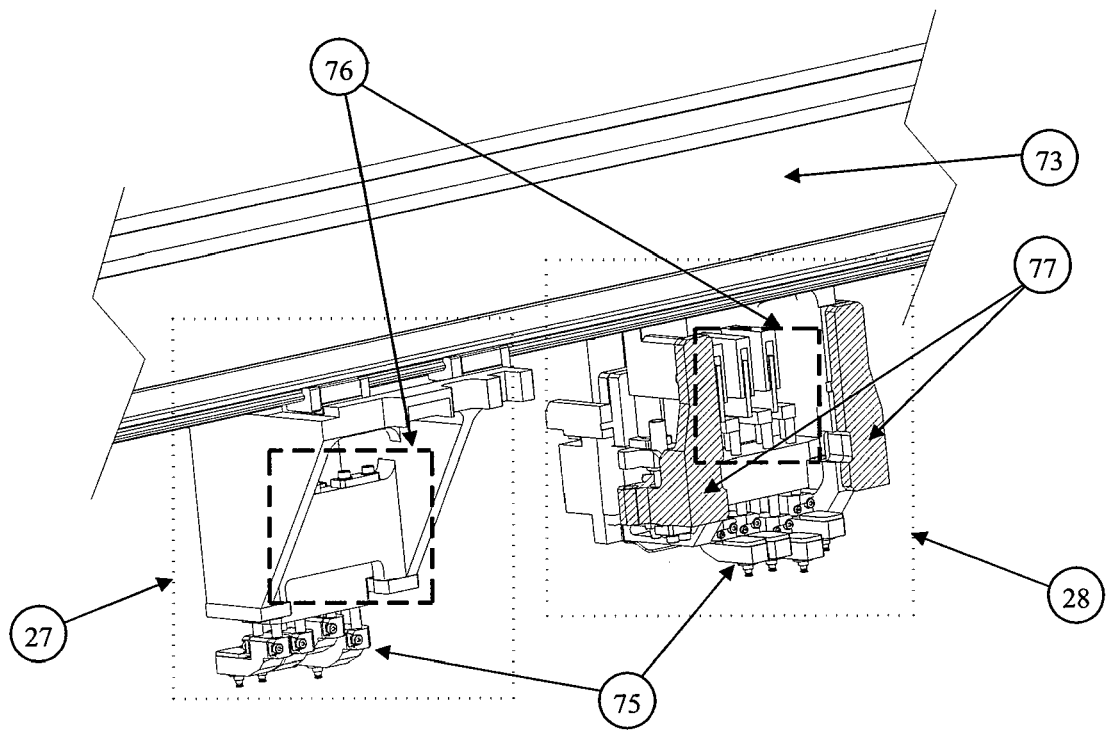
FIG. 12 is an isometric view of the dual offload arms.

A sixth aspect of the invention relates to the design and operation of the dual offload arms which consist of a front pick arm 27 and rear pick arm 28. FIG. 11 is an end view of the dual offload arms 26 showing their face to face co-center relationship and their basic structure. FIG. 12 is the isometric view of the dual offload arms 26. The rear arm facing to the front has a global up/down axis with a larger traveling distance of about 25 mm that is driven by an actuator, such as pneumatic cylinders 77. It is for enabling one arm to give way to another during reciprocal movement of the pick arms 27, 28 back and forth.

The two arms 27, 28 are arranged in a face-to-face configuration as shown in FIG. 11, such that the vacuum pick heads 75 on each offload arm 27, 28 are aligned along the same pick and place center line of the system.

The offload arms 26 are preferably driven by a direct drive linear motor 73 that can provide a compact and simple assembly. The front pick arm 27 and rear pick arm 28 have a common center line 74.

Figure 13:
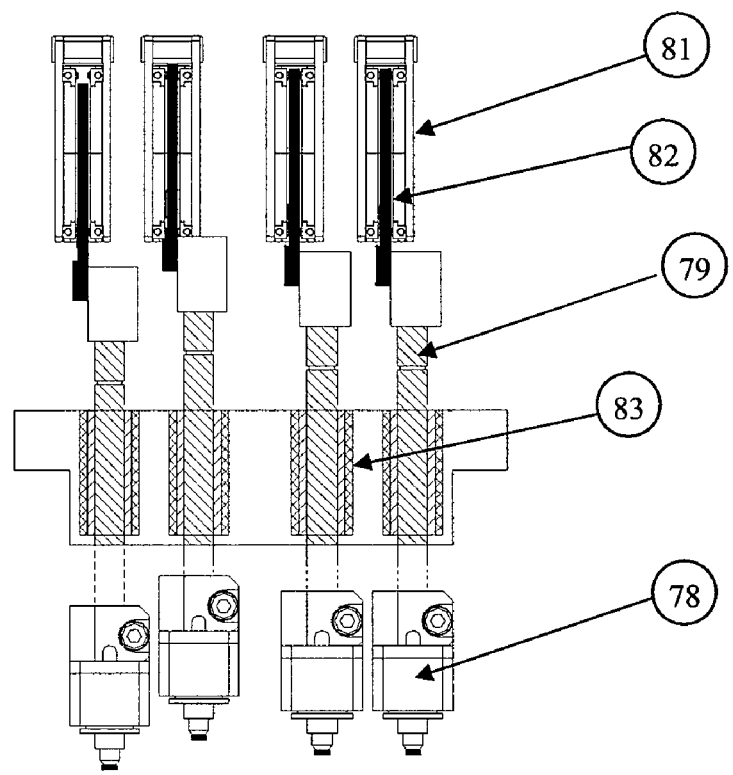
FIG. 13 is a front view of an offload arm illustrating small vertical movement of an individual vacuum head for pick-and-place actions.
Figure 14:
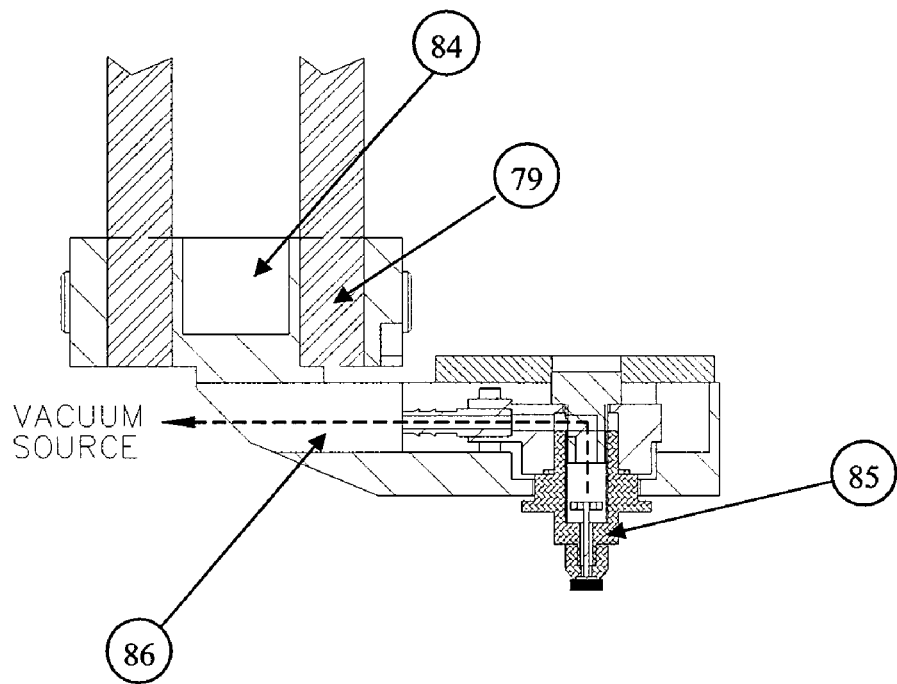
FIG. 14 is an enlarged sectional side view of an individual vacuum head of the dual offload arms.

FIG. 13 is a front view of an offload arm illustrating small vertical movement of an individual vacuum head 75 for pick-and-place actions. FIG. 14 is an enlarged sectional side view of an individual vacuum head of the dual offload arms 26. A pick arm pick head adaptor 84 holds a plurality of vacuum heads 75.

Each arm has four vacuum heads 75, or a larger number of heads when higher throughput is required. Each vacuum head 75 further comprises an individual pick head finger 78. Each pick head finger 78 has a convertible part 85 for changing a collet for catering to packages of different dimensions. Vacuum suction is generated at the tip of the convertible part 85 through a vacuum path 86 that is linked to a vacuum source.

Each vacuum head 75 is configured for vertical motion of a small traveling distance of about 5 mm independently of the other vacuum heads 75 that is good enough for package transfer operations from the vacuum heads 48 of the rotary turret device 20 to the offloading device 29, 30. The small vertical motion distance is best driven by an independent voice coil 76 that provides a compact driving system. The voice coil motor 76 may comprise a magnet assembly 81 that interacts with a moving voice coil 82. Each voice coil 82 is directly connected to a pair of guide rods 79 which is linearly guided by a pair of linear cage bearing guides 83 as shown in FIG. 13. The pair of guide rods 79 is further connected to a vacuum pick head 75 by passing them through a pair of through holes of the vacuum pick head 75 and fixed by screws like a C-clamp. The coupling which starts from the voice coil 76 down to the vacuum pick head 75 is direct and simple, and thus free of backlash.

Figure 15:
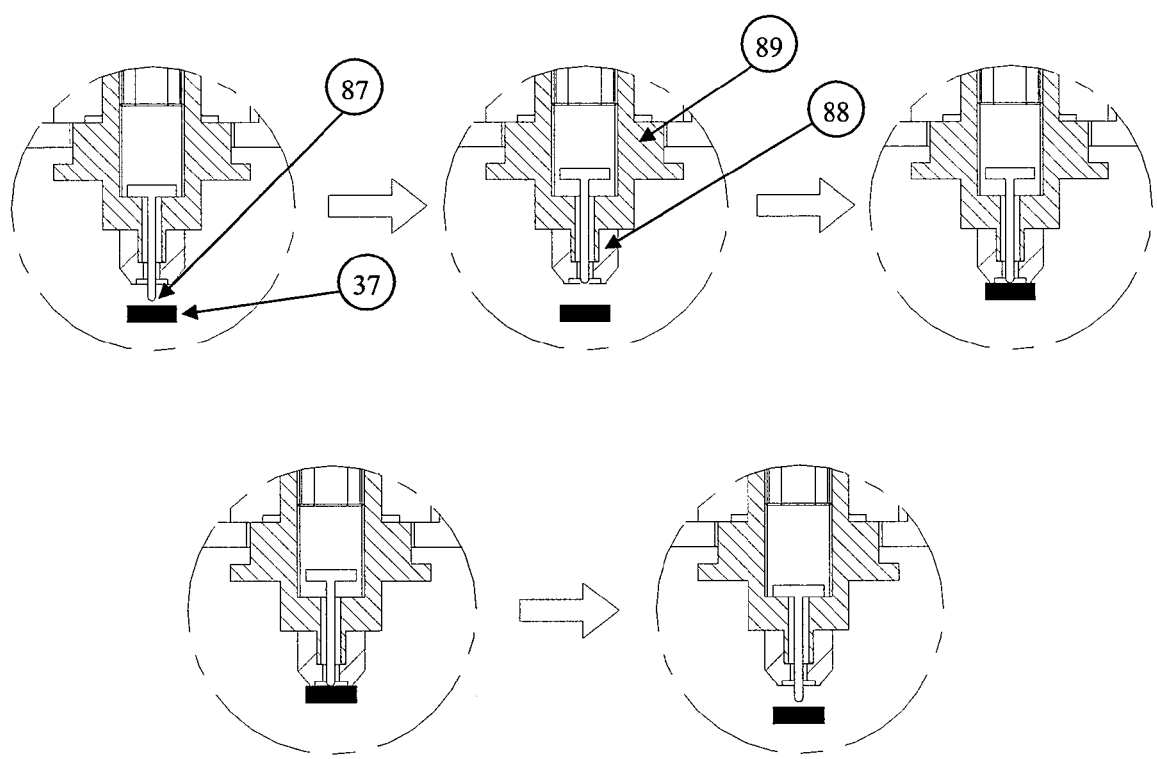
FIG. 15 shows the working sequence of a vacuum head comprising a small release-assist pin inside the collet holder of the vacuum head.

A seventh aspect of the invention relates to the design of the vacuum pick heads 75 of the offload arms 27, 28 and how the packages are released. FIG. 15 shows the working sequence of a vacuum head comprising a small release-assist pin 87 inside the collet holder 89 of the collet 88.

Packages 37 sticking on the collet 88 of the pick head 75 is a common problem, especially for small packages (say sizes of 3 mm×3 mm and 4 mm×4 mm), during offloading of packages to tray pockets as there is no suction assist at the tray pockets. To assist the release of packages 37, a small pin 87 is implemented inside the collet holder 89 as shown in FIG. 14.

The small pin 87 consists of mainly two parts, namely a flat upper base and a thin stem. The working sequence is as follows (shown in FIG. 15):

1. Before the package 37 is picked up, the small pin 87 stays inside the collet holder 89 with its flat base resting on an inner base wall of the collet holder 89, and the tip of its thin stem protrudes out of the collet 88.

2. When the vacuum suction is activated, the small pin 87 inside the collet holder 89 will rise and the pin tip will be drawn back into the collet holder 89 because the vacuum air flow will act upon the flat base of the pin and bring it upwards. As a result, the small pin 87 will not affect the usual package pick up process.

3. The pick head 88 will descend and pick up the package by suction as usual.

4. The offload arm 27, 28 carrying the pick heads 75 will go to an offloading device 29, 30, such as a tray with pockets. At the proper position and level, the pick head 88 will release the package 37 by switching off the vacuum suction and the small pin 87 inside the collet holder 89 will fall down and its tip will push against the package 37 to aid its separation from the collet 88.

5. The tip can therefore reliably assist the process of releasing the package 37 into a pocket of the tray without the package sticking on the collet 88. That can lead to more accurate placement of the package 37 into the pocket.

6. The package pick and place cycle will be repeated from steps 1 to 5 for other packages.

An eighth aspect of the invention relates to the design and operations of a tray carrier and its handling for accurate positioning of the tray and thus accurate package placement.

Figure 16:
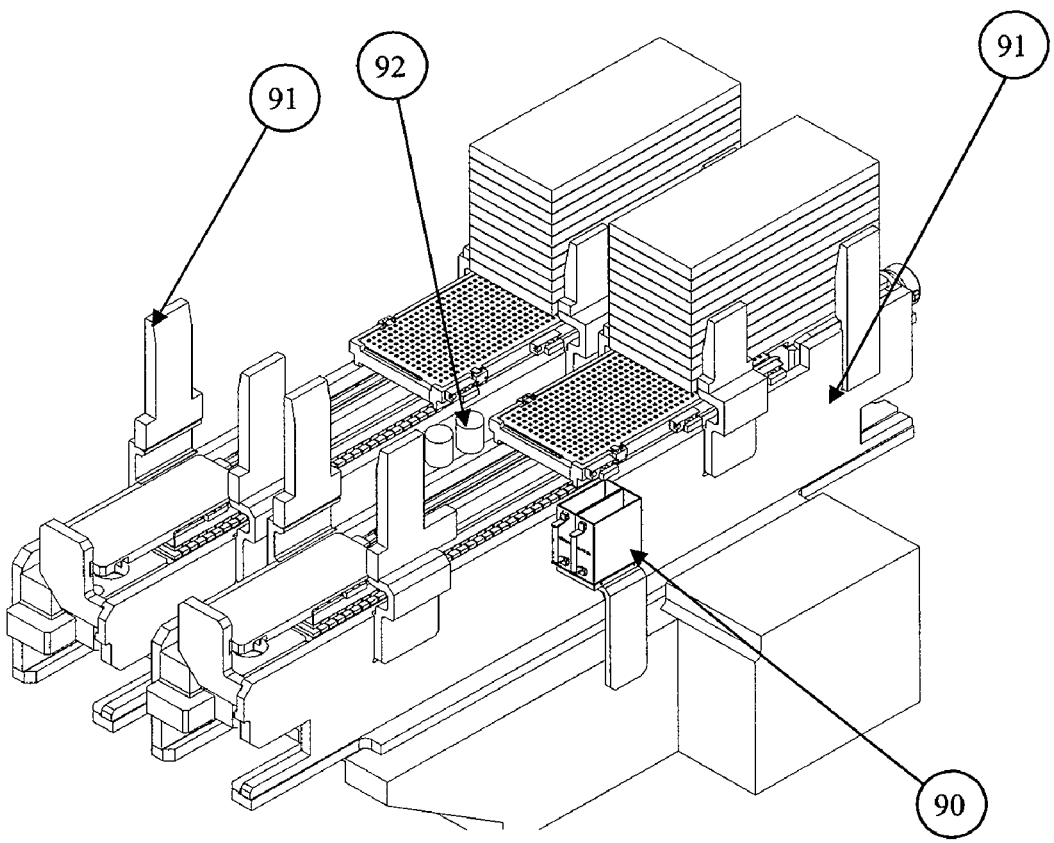
FIG. 16 shows a possible offload configuration of an offloading device according to the preferred embodiment of the invention.
Figure 17:
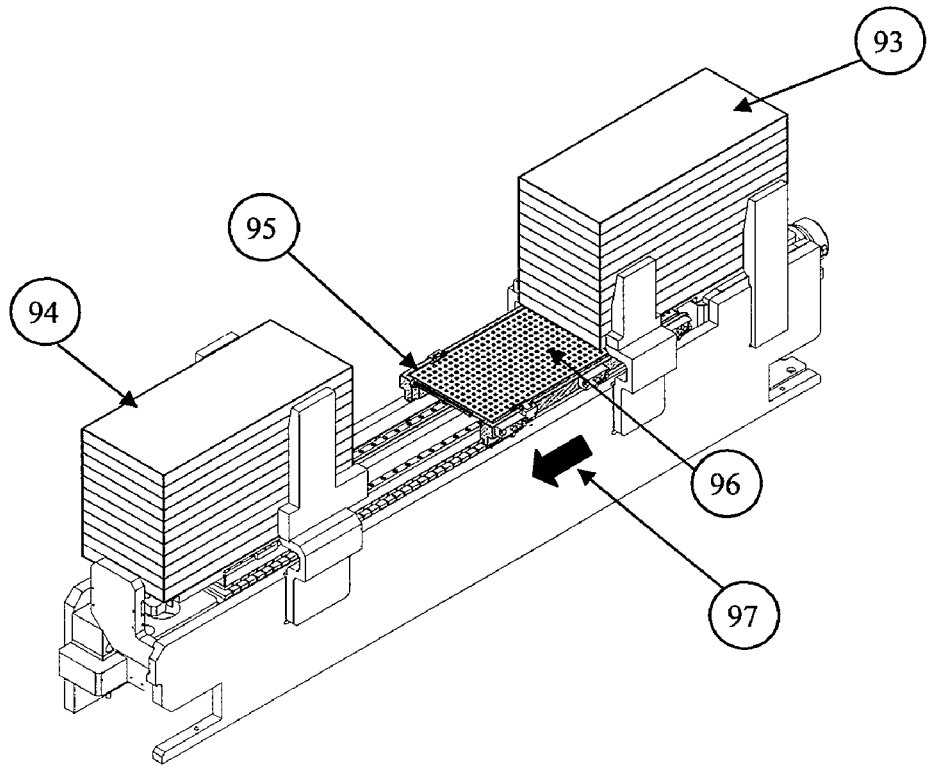
FIG. 17 is an isometric view of a tray offloader.
Figure 18:
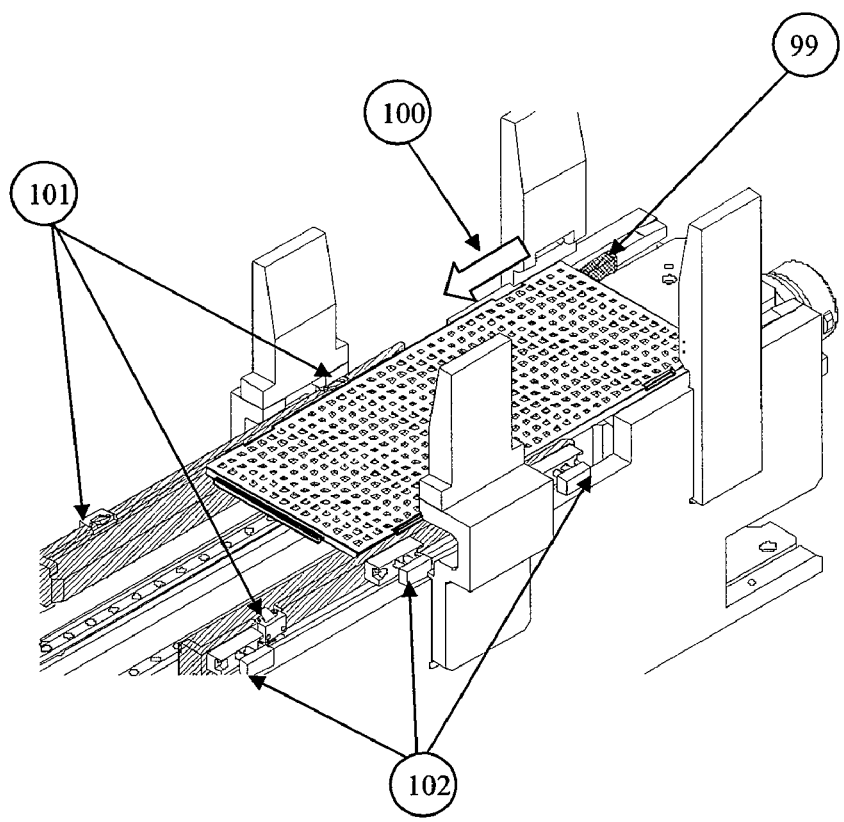
FIG. 18 is an isometric view of an empty tray being loaded onto a tray carrier by the push of a tray kicker.
Figure 19:
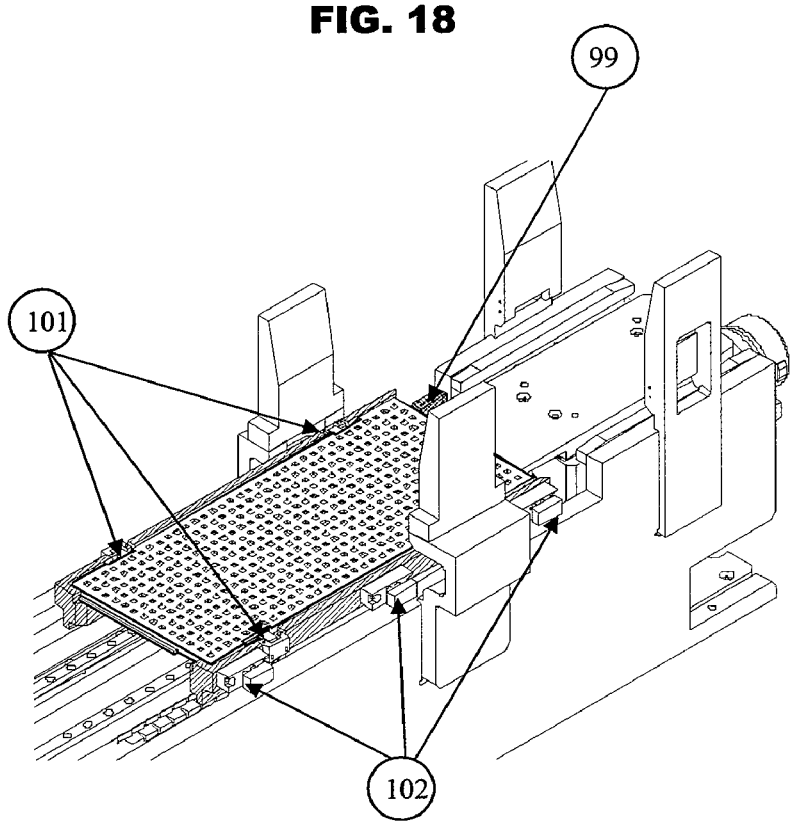
FIG. 19 is an isometric view of the empty tray when it is fully input onto the tray carrier.
Figure 20:
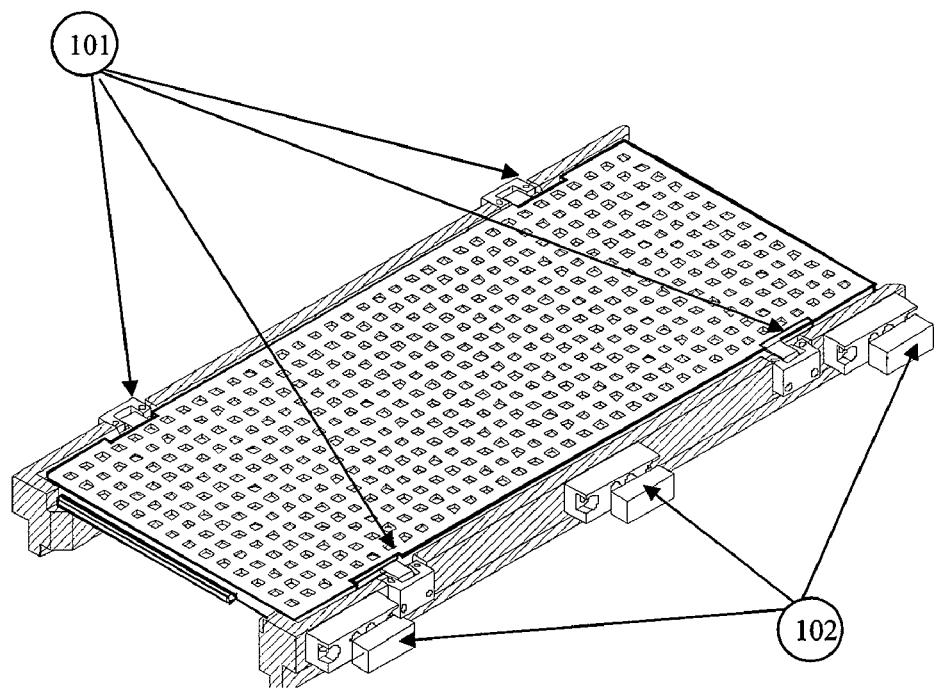
FIG. 20 is an isometric view of the tray being adjusted on the tray carrier to remove clearance between the tray and the tray carrier.
Figure 21:
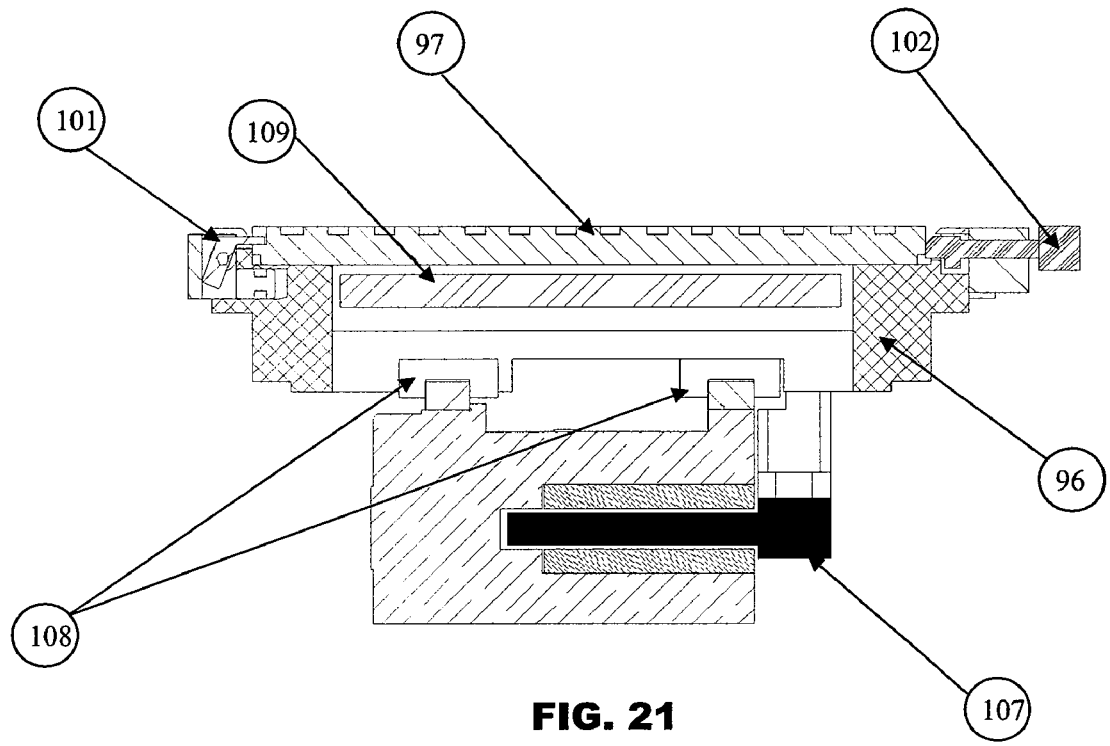
FIG. 21 is a cross-sectional end view of the tray carried on the tray carrier which further illustrates a linear motor that is coupled to the tray carrier.

FIG. 16 shows a possible offload configuration of an offloading device according to the preferred embodiment of the invention. The offloading device comprises a tray offload module 91, a canister offload 92 and a bin offload 90. FIG. 17 is an isometric view of a tray offloader, wherein an empty tray 96 is taken from an empty tray stack 93 in a tray indexing direction 97, filled with packages 37 and then inserted into a filled tray stack 94 once the tray 96 is filled. Instead of a tray offload module 91, a tube offload module can be fixed depending on the type of package. FIG. 18 is an isometric view of an empty tray being loaded onto a tray carrier by the push of a tray pusher or tray kicker. FIG. 19 is an isometric view of the empty tray when it is fully input onto the tray carrier. FIG. 20 is an isometric view of the tray being adjusted on the tray carrier to remove clearance between the tray and the tray carrier. FIG. 21 is a cross-sectional end view of the tray carried on the tray carrier which further illustrates a linear motor that is coupled to the tray carrier.

The operational sequence is as follows (as shown FIGS. 17, 18 and 19):

1. A tray 96 is loaded onto the offloading station 29.

2. The tray carrier 95 will move to collect the tray 96 while the tray kicker 99 pushes the tray 96 at the back of the tray 96 along a loading path 100 to assist this process.

3. With the assistance of the push of the tray kicker 99, the tray 96 can move totally into the tray carrier with no or negligible clearance with the front reference wall of the tray carrier 95.

4. The tray carrier 95 has three side pushers 102 at one side of the carrier 95. After the tray 96 goes into the tray carrier 95 as mentioned in step 3, the three side pushers 102 will push the tray to another side of the carrier 95 (that is opposite to the side having the side pushers 102) such that the tray leaves no or a negligible clearance with a side reference wall of the tray carrier. As a result, the tray 96 can have a consistent position with respect to front and side reference walls of the carrier 95. Having such a consistent position of the tray 96 with respect to the carrier 95 is the pre-requisite of the accurate positioning of the tray 96 and subsequent accurate package offloading to tray pockets.

5. After fully loading the tray 96 into the carrier 95 with a consistent relative position, four clamps 101, locating near to four corners of the carrier 95, will activate to fix the tray 96 such that its relative position does not change in the subsequent operations.

6. The tray carrier 95 with the tray 96 moves in the Y-direction to stop at a position such that the first row of pockets of the tray 96 are aligned with the pick and place center line of the system. Therefore, the dual offload pick arms 26 that are moving in X-direction can place the packages into the tray pockets accurately.

7. When the pockets of the first row of the tray 96 are filled with packages 37, the tray carrier 95 will index one row forward and so on until all rows of the tray 96 are filled with packages.

8. The full tray 96 will then be moved further forward into the unloading station 109 where the tray 96 is elevated to the unloading stacker 94 by the elevator of the unloading station moving upwards through the opening of the tray carrier 95. Then, the carrier will return to the loading position and the cycle repeats from step 1.

To further enhance the tray accuracy, the tray carrier 95 is preferably driven by a linear motor 107. As shown in FIG. 21, the tray carrier is mounted onto a linear motion guide 108 which is in turn mounted onto a magnet holder of the linear motor 107 so that the overall size is compact. A voice coil motor comprised in the linear motor 107 is directly connected to the bottom of the tray carrier 95 through screws and a spacer such that no or negligible backlash is introduced. An accurate positioning of the tray carrier 95 is thus obtained.

The various aspects of the invention result in improvements in maintaining high system throughput while multiple processes and operations of the packages are being performed, such as package précising, inspections especially of the markings, the top surfaces and four sides of the packages. A cost effective part conversion for different package types and form factors is also introduced. For the dual buffer boats 13, 14, a simple flat vacuum plate 32 with an array of small holes 33 is used, instead of a plate consisting of complicated guiding features to maintain the locations of packages 37. An efficient parts conversion system is thereby achieved. Further, a more reliable package release process is achieved by adding the package release-assist pin 87 inside the collet holder of the dual offload arms 27, 28. Moreover, a more accurate tray offload process is achieved by introducing the concept of the movable tray carrier 95.

The invention described herein is susceptible to variations, modifications and/or addition other than those specifically described and it is to be understood that the invention includes all such variations, modifications and/or additions which fall within the spirit and scope of the above description.

The invention claimed is:

1. A singulation handler system for a strip of electronic packages, comprising:
   an onloader located adjacent to an onloading location for providing an unsingulated strip of packages for singulation;
   a cutting jig for mounting the strip of unsingulated packages, the cutting jig being movable between the onloading location and a singulation location at which the strip is singulated by a singulation engine;

a buffer boat for holding singulated packages that have been removed from the cutting jig and which is operative to convey the singulated packages in a fixed relative orientation;

a gang pick head for transferring multiple singulated packages simultaneously from the buffer boat to a rotary turret device; and an offloader for transferring singulated packages from the rotary turret device to containers in which the singulated packages are storable.

2. The singulation handler system as claimed in claim 1, further comprising a strip précising station at the onloading location for aligning the strip of unsingulated packages with respect to the cutting jig.

3. The singulation handler system as claimed in claim 1, further comprising an unloading arm that is operative to pick up singulated packages from the cutting jig in the same relative arrangement as they were arranged on the strip before singulation.

4. The singulation handler system as claimed in claim 3, further comprising a washing and drying station that is operative to wash and dry the singulated packages while they are being held by the unloading arm.

5. The singulation handler system as claimed in claim 4, further comprising an air knife located next to the washing and drying station.

6. The singulation handler system as claimed in claim 3, wherein the buffer boat is configured to receive singulated packages from the unloading arm and to hold the singulated packages in the same relative arrangement as they were arranged on the strip before singulation.

7. The singulation handler system as claimed in claim 6, further comprising an air knife located above a conveying path of the buffer boat.

8. The singulation handler system as claimed in claim 1, wherein the rotary turret device comprises a plurality of detachable vacuum heads spaced along the rotary turret device, each vacuum head being operative to hold a package during rotation of the turret device to move the packages through different stations located at different segments of the turret device.

9. The singulation handler system as claimed in claim 1, further comprising a mark inspection system between the buffer boat and the rotary turret device for inspecting the singulated packages which are being held by the gang pick head.

10. The singulation handler system as claimed in claim 1, wherein the offloader comprises dual offloading arms, each offloading arm further comprising multiple individual vacuum pick heads.

11. The singulation handler system as claimed in claim 10, wherein one offloading arm is arranged and configured to have a larger vertical traveling distance than the other offloading arm.

12. The singulation handler system as claimed in claim 10, wherein each individual vacuum pick head of an offloading arm is configured for small vertical movement independently of the other vacuum pick heads.

13. The singulation handler system as claimed in claim 10, wherein each vacuum pick head further comprises a release-assist pin inside a collet of the vacuum pick head, which is movable between a first position whereat the pin is retracted inside the collet when vacuum suction is activated, and a second position whereat the pin extends out of the collet for pushing against a singulated package held by the collet when vacuum suction is deactivated.

14. The singulation handler system as claimed in claim 1, wherein the containers comprise trays that are positioned onto a movable tray carrier during storage of packages into the trays.

15. The singulation handler system as claimed in claim 14, wherein the movable tray carrier further comprises front and side fixed reference walls, and back and side pushers to push the tray so as to secure it against the front and side walls respectively.

16. The singulation handler system as claimed in claim 1, wherein the onloader is located at a side of the onloading location, such that a material flow direction of an unsingulated strip of packages to the onloading location is in a direction substantially perpendicular to the direction of movement of the cutting jig between the onloading location and the singulation engine.

17. The singulation handler system as claimed in claim 16, wherein the strip of unsingulated packages are loaded onto the cutting jig in a lengthwise orientation which is parallel to the material flow direction.

18. The singulation handler system as claimed in claim 1, wherein the onloader is located in front of the onloading location, such that a material flow direction of an unsingulated strip of packages to the onloading location is in a direction substantially parallel to the direction of movement of the cutting jig between the onloading position and the singulation engine.

19. The singulation handler system as claimed in claim 18, wherein the unsingulated strip of packages are loaded onto the cutting jig in a lengthwise orientation which is perpendicular to the material flow direction.

\* \* \* \* \*